(12) United States Patent
Hsiao

(10) Patent No.: US 6,444,584 B1
(45) Date of Patent: Sep. 3, 2002

(54) PLASMA ETCH METHOD FOR FORMING COMPOSITE SILICON/DIELECTRIC/SILICON STACK LAYER

(75) Inventor: Yung-Kuan Hsiao, Hsinchu (TW)

(73) Assignee: Taiwan Semiconductor Manufacturing Company

( * ) Notice: Subject to any disclaimer, the term of this patent is extended or adjusted under 35 U.S.C. 154(b) by 318 days.

(21) Appl. No.: 09/116,612

(22) Filed: Jul. 16, 1998

(51) Int. Cl.[7] .............................................. H01L 21/302

(52) U.S. Cl. ........................ 438/706; 438/710; 438/712; 438/714

(58) Field of Search ................................ 438/706, 710, 438/714, 712, 719, 720, 723, 253, 254, 396, 381

(56) References Cited

U.S. PATENT DOCUMENTS

| | | | |
|---|---|---|---|
| 5,094,712 A | 3/1992 | Becker et al. | 156/643 |
| 5,162,259 A * | 11/1992 | Kolar et al. | 437/192 |
| 5,346,586 A | 9/1994 | Keller | 156/656 |
| 5,525,542 A | 6/1996 | Manian et al. | 437/186 |
| 5,759,746 A * | 6/1998 | Azuma et al. | 430/313 |
| 5,837,428 A * | 11/1998 | Huang et al. | 430/313 |
| 5,907,773 A * | 5/1999 | Ikemasu et al. | 438/254 |

OTHER PUBLICATIONS

Stanley Wolf and R.N. Tauber, Silicon processing for VSLI era, vol. 1, pp. 557, 1986.*

* cited by examiner

Primary Examiner—Benjamin L. Utech
Assistant Examiner—Lan Vinh
(74) Attorney, Agent, or Firm—George O. Saile; Stephen B. Ackerman

(57) ABSTRACT

A method for forming a patterned composite stack layer within a microelectronics fabrication. There is first provided a substrate. There is then formed over the substrate a blanket first silicon layer. There is then formed forming upon the blanket first silicon layer a blanket silicon containing dielectric layer. There is then formed upon the blanket silicon containing dielectric layer a blanket second silicon layer. There is then formed upon the blanket second silicon layer a blanket organic polymer anti-reflective coating (ARC) layer. There is then formed upon the blanket organic polymer anti-reflective coating (ARC) layer a patterned photoresist layer. Finally, there is then etched sequentially while employing the patterned photoresist layer as a photoresist etch mask the blanket organic polymer anti-reflective coating (ARC) layer, the blanket second silicon layer, the blanket silicon containing dielectric layer and the blanket first silicon layer to form a patterned composite stack layer comprising a patterned second silicon layer coextensive with a patterned silicon containing dielectric layer in turn coextensive with a patterned first silicon layer, where the sequential etching is undertaken employing a single plasma etch method employing an etchant gas composition which upon plasma activation forms a chlorine containing etchant species.

15 Claims, 2 Drawing Sheets

PLASMA ETCH METHOD FOR FORMING COMPOSITE SILICON/DIELECTRIC/SILICON STACK LAYER

BACKGROUND OF THE INVENTION

1. Field of the Invention

The present invention relates generally to composite multi-layer stack layers within microelectronics fabrications. More particularly, the present invention relates to plasma etch methods for forming patterned composite multi-layer stack layers within microelectronics fabrications.

2. Description of the Related Art

Microelectronics fabrications are formed from microelectronics substrates over which are formed patterned microelectronics conductor layers which are separated by microelectronics dielectric layers.

As microelectronics fabrication integration levels have increased and microelectronics fabrication device and patterned conductor layer dimensions have decreased, it has become increasingly important to efficiently form within microelectronics fabrications patterned composite polysilicon/silicon oxide/polysilicon stack layers. Such patterned composite polysilicon/silicon oxide/polysilicon stack layers are typically employed within microelectronics. fabrications for forming microelectronics structures such as but not limited to polysilicon capacitors, as well as gate electrodes employed within field effect transistors (FETs) such as electrically erasable programmable read only memory (EEPROM) field effect transistors (FETs) (which are also known as electrically alterable programmable read only memory (EAPROM) field effect transistors (FETs)).

While patterned composite polysilicon/silicon oxide/polysilicon stack layers are thus desirable within the art of microelectronics fabrication, patterned composite polysilicon/silicon oxide/polysilicon stack layers are nonetheless not formed entirely without problems within microelectronics fabrications. In particular, patterned composite polysilicon/silicon oxide/polysilicon stack layers when formed within microelectronics fabrications while employing a conventional plasma etch method employing a patterned photoresist etch mask layer often suffer from detrimental effects, such as microloading effects, when attempting to form the patterned composite polysilicon/silicon oxide/polysilicon stack layers with variable pattern density. Similarly, although microloading effects may often be attenuated when forming patterned composite polysilicon/silicon oxide/polysilicon stack layers while employing more sophisticated plasma etch methods employing multiple masking layers or plasma etchants, such alternative plasma etch methods typically provide enhanced process. complexity when forming patterned composite polysilicon/silicon oxide/polysilicon stack layers.

It is thus towards the goal of forming with enhanced process efficiency and attenuated microloading effect within a microelectronics fabrication a patterned composite polysilicon/silicon oxide/polysilicon stack layer that the present invention is more specifically directed. In a more general sense, the present invention is also directed towards the goal of forming with enhanced process efficiency and attenuated microloading effect within a microelectronics fabrication a patterned composite silicon/dielectric/silicon stack layer.

Various novel plasma etch methods have been disclosed within the art of microelectronics fabrication for forming patterned microelectronics layers within microelectronics fabrications.

For example, Becker et al., in U.S. Pat. No. 5,094,712, discloses a plasma etch method for efficiently forming an anisotropically patterned composite silicon oxide/tungsten silicide/polysilicon stack layer within an integrated circuit microelectronics fabrication. The method employs a single plasma reactor chamber within which there is sequentially and anisotropically etched: (1) a blanket silicon oxide layer while employing a carbon tetrafluoride, trifluoromethane and inert gas plasma to form a patterned silicon oxide layer; (2) a blanket tungsten silicide layer while employing a helium, oxygen and sulfur hexafluoride plasma to form a patterned tungsten silicide layer co-extensive with the patterned silicon oxide layer; and (3) a blanket polysilicon layer while employing a hydrogen bromide and chlorine plasma to form a patterned polysilicon layer co-extensive with the patterned tungsten silicide layer and the patterned silicon oxide layer.

In addition, Keller, in U.S. Pat. No. 5,346,586, discloses a plasma etch method for forming with high selectivity with respect to a silicon oxide gate dielectric layer within an integrated circuit microelectronics fabrication a patterned polycide gate electrode upon the silicon oxide gate dielectric layer within the integrated circuit microelectronics fabrication. The method employs an oxide hard mask layer from whose surface is first stripped while employing an ozone plasma stripping method a patterned photoresist layer employed in defining the oxide hard mask layer prior to employing the oxide hard mask layer as an etch mask layer for forming with selectivity with respect to the silicon oxide gate dielectric layer the polycide gate electrode upon the silicon oxide gate dielectric layer.

Finally, Maniar et al., in U.S. Pat. No. 5,525,542, discloses a method for forming within an integrated circuit microelectronics fabrication an accurately patterned reflective conductor layer while employing deep ultra-violet (DUV) photoexposure radiation of less than 300 nanometers when forming from a blanket photoresist layer a patterned photoresist layer employed in defining the accurately patterned reflective conductor layer. The method employs a blanket aluminum nitride layer formed interposed between the blanket reflective conductor layer and the blanket photoresist layer, where the blanket aluminum nitride layer serves as an anti-reflective coating (ARC) layer having particularly effective anti-reflective properties with respect to photo-exposure radiation within the deep ultra-violet (DUV) photoexposure radiation region of less than 300 nanometers.

Desirable in the art of microelectronics fabrication are methods through which there may efficiently and with attenuated microloading effect be formed patterned composite silicon/dielectric/silicon stack layers within microelectronics fabrications. More particularly desirable in the art of microelectronics fabrication are methods through which there may efficiently and with attenuated microloading effect be formed patterned composite polysilicon/silicon oxide/polysilicon stack layers within microelectronics fabrications.

It is towards the foregoing goals that the present invention is both generally and more specifically directed.

SUMMARY OF THE INVENTION

A first object of the present invention is to provide a method for forming within a microelectronics fabrication a patterned composite silicon/dielectric/silicon stack layer.

A second object of the present invention is to provide a method in accord with the first object of the present invention, where the patterned composite silicon/dielectric/ silicon stack layer is efficiently formed with an attenuated microloading effect.

A third object of the present invention is to provide a method in accord with the first object of the present invention or the second object of the present invention, which method is readily commercially implemented.

In accord with the objects of the present invention, there is provided a method for forming within a microelectronics fabrication a patterned composite layer stack. To practice the method of the present invention, there is first provided a substrate. There is then formed over the substrate a blanket first silicon layer. There is then formed upon the blanket first silicon layer a blanket silicon containing dielectric layer. There is then formed upon the blanket silicon containing dielectric layer a blanket second silicon layer. There is then formed upon the blanket second silicon layer a blanket organic polymer anti-reflective coating (ARC) layer. There is then formed upon the blanket organic polymer anti-reflective coating (ARC) layer a patterned photoresist layer. Finally, there is then etched sequentially while employing the patterned photoresist layer as a photoresist etch mask layer the blanket organic polymer anti-reflective coating (ARC) layer, the blanket second silicon layer, the blanket silicon containing dielectric layer and the blanket first silicon layer to form a patterned composite layer stack comprising a patterned second silicon layer coextensive with a patterned silicon containing dielectric layer in turn coextensive with a patterned first silicon layer, where the sequential etching is undertaken employing a single plasma etch method employing a single etchant gas composition which upon plasma activation forms a chlorine containing etchant species.

The present invention provides a method for efficiently and with attenuated microloading effect forming within a microelectronics fabrication a patterned composite silicon/ dielectric/silicon stack layer. The method of the present invention realizes the foregoing objects by employing when forming the patterned composite silicon/dielectric/silicon stack layer a blanket organic polymer anti-reflective coating (ARC) layer in conjunction with a single plasma etch method employing a single etchant gas composition which upon plasma activation forms a chlorine containing etchant species.

The method of the present invention is readily commercially implemented. The method of the present invention employs methods and materials as are generally known in the art of microelectronics fabrication. Since it is a novel ordering of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a plasma etch method for efficiently and with attenuated microloading effect forming within a microelectronics fabrication a patterned composite silicon/dielectric/silicon stack layer. The present invention realizes the foregoing objects by employing when forming the patterned composite silicon/dielectric/silicon stack layer a blanket organic polymer anti-reflective coating (ARC) layer formed interposed between a patterned photoresist layer employed in defining the patterned composite silicon/ dielectric/silicon stack layer and a blanket composite silicon/ dielectric/silicon stack layer from which is formed the patterned composite silicon/dielectric/silicon stack layer, in conjunction with a single plasma etch method employing a single etchant gas composition which upon plasma activation forms a chlorine containing etchant species.

Although the method of the present invention provides value when forming within a semiconductor integrated circuit microelectronics fabrication a patterned composite silicon/dielectric/silicon stack layer which may be employed as a polysilicon capacitor, the present invention may be employed when fabricating within microelectronics fabrications including but not limited to semiconductor integrated circuit microelectronics fabrications, solar cell microelectronics fabrications, ceramic substrate microelectronics fabrications and flat panel display microelectronics fabrications patterned composite silicon/dielectric/silicon stack layers which may be employed within microelectronics structures including but not limited to capacitor structures within microelectronics fabrications in general and gate electrode structures within certain types of field effect transistors (FETs) within semiconductor integrated circuit microelectronics fabrications more particularly.

First Preferred Embodiment

Figure 1:
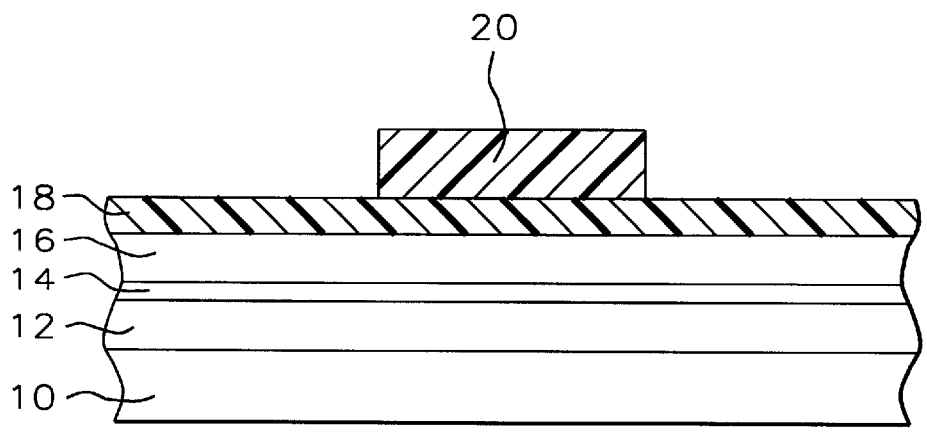
FIG. 1, FIG. 2 and FIG. 3 show a series of schematic cross-sectional diagrams illustrating the results of forming within a microelectronics fabrication in accord with a general embodiment of the present invention which comprises a first preferred embodiment of the present invention a patterned composite silicon/dielectric/silicon stack layer.
Figure 2:
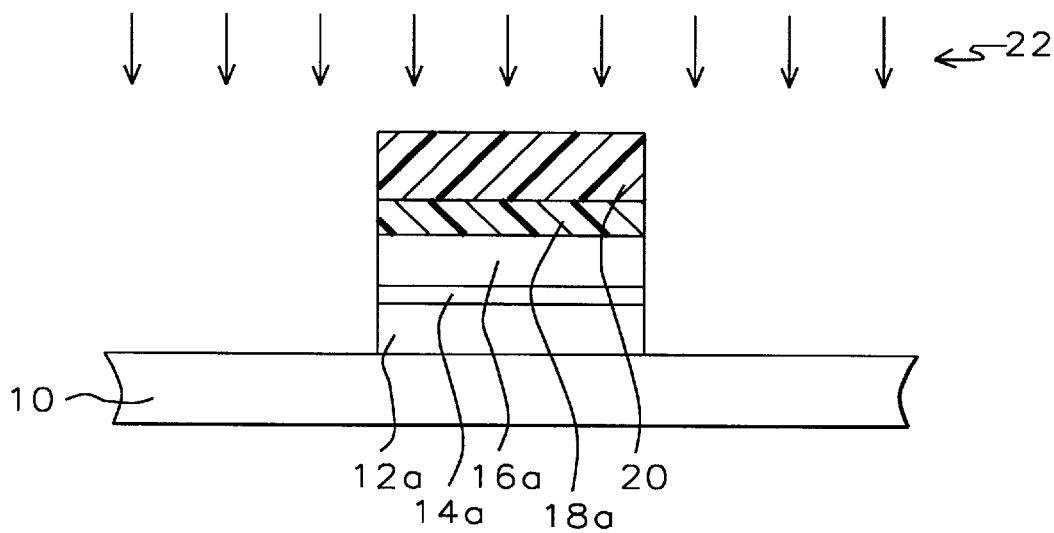
Figure 3:
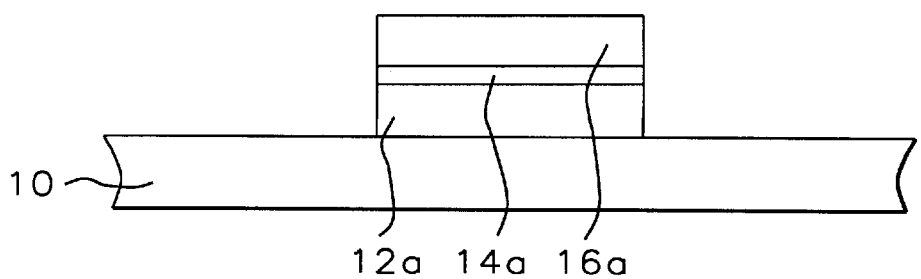

Referring now to FIG. 1 to FIG. 3, there is shown a series of schematic cross-sectional diagrams illustrating the results of forming within a microelectronics fabrication in accord with a general embodiment of the present invention which comprises a first preferred embodiment of the present invention a patterned composite silicon/dielectric/silicon stack layer within the microelectronics fabrication. Shown in FIG. 1 is a schematic cross-sectional diagram of the microelectronics fabrication at an early stage in its fabrication in accord with the first preferred embodiment of the present invention.

Shown in FIG. 1 is a substrate 10 having formed thereupon or thereover a series of four blanket layers. The series of four blanket layers includes: (1) a blanket first silicon layer 12 formed upon the substrate 10; (2) a blanket silicon containing dielectric layer 14 formed upon the blanket first silicon layer 12; (3) a blanket second silicon layer 16 formed upon the blanket silicon containing dielectric layer 14; and (4) a blanket organic polymer anti-reflective coating (ARC) layer 18 formed upon the blanket second silicon layer 16. Finally, there is also shown within FIG. 1 a patterned photoresist layer 20 formed upon the blanket organic polymer anti-reflective coating (ARC) layer 18.

Within the first preferred embodiment of the present invention with respect to the substrate 10, the substrate may be a substrate employed within a microelectronics fabrication selected from the group including but not limited to a semiconductor integrated circuit microelectronics fabrication, a solar cell microelectronics fabrication, a ceramic substrate microelectronics fabrication or a flat panel display microelectronics fabrication. Although not specifically illustrated within the schematic cross-sectional diagram of FIG. 1, the substrate 10 may be a substrate alone employed within a microelectronics fabrication, or in the alternative, the substrate 10 may be a substrate employed within a microelectronics fabrication, where the substrate has formed thereupon or thereover any of several additional microelectronics layers as are conventionally employed within the microelectronics fabrication. Such additional microelectronics layers may include, but are not limited to, microelectronics conductor layers, microelectronics semiconductor layers and microelectronics dielectric layers.

Within the first preferred embodiment of the present invention with respect to the blanket first silicon layer 12 and the blanket second silicon layer 16, the blanket first silicon layer 12 and the blanket second silicon layer 16 may each be formed employing methods and materials as are conventional in the art of microelectronics fabrication, such methods including but not limited to chemical vapor deposition (CVD) methods, plasma enhanced chemical vapor deposition (PECVD) methods and physical vapor deposition (PVD) sputtering methods through which may be formed silicon layers formed of silicon materials including but not limited to amorphous silicon materials, monocrystalline silicon materials and polycrystalline silicon (i.e. polysilicon) materials. With respect to each of the blanket first silicon layer 12 and the blanket second silicon layer 16, each of the blanket first silicon layer 12 and the blanket second silicon layer 16 is more preferably a blanket polysilicon layer having incorporated therein a suitable dopant at a concentration of from about 1E19 to about 5E19 dopant atoms per cubic centimeter to provide each of the blanket first silicon layer 12 and the blanket second silicon layer 16 with a resistivity of from about 50 to about 300 ohms per square. Preferably, each of the blanket first silicon layer 12 and the blanket second silicon layer 16 is formed to a thickness of from about 300 to about 1500 angstroms.

Within the first preferred embodiment of the present invention with respect to the blanket silicon containing dielectric layer 14, the blanket silicon containing dielectric layer 14 may be formed employing methods and materials as are conventional in the art of microelectronics fabrication, such methods including but not limited to chemical vapor deposition (CVD) methods, plasma enhanced chemical vapor deposition (PECVD) methods, physical vapor deposition (PVD) sputtering methods, thermal nitridation methods and ion implant nitridation methods through which may be formed silicon containing dielectric layers including but not limited to silicon oxide dielectric layers, silicon nitride dielectric layers, silicon oxynitride dielectric layers and composites of silicon oxide dielectric layers, silicon nitride dielectric layers and silicon oxynitride dielectric layers. Preferably, the blanket silicon containing dielectric layer 14 is formed to a thickness of from about 300 to about 1500 angstroms.

Within the first preferred embodiment of the present invention with respect to the blanket organic polymer anti-reflective coating (ARC) layer 18, the blanket organic polymer anti-reflective coating (ARC) layer 18 may be formed from any of several organic polymer anti-reflective coating (ARC) materials as are conventional in the art of microelectronics fabrication, whether such organic polymer anti-reflective coating (ARC) materials are intrinsically anti-reflective due to absorption of photoexposure radiation within the polymer backbone of the organic polymer anti-reflective coating (ARC) materials, or in the alternative, whether such organic polymer anti-reflective coating (ARC) materials have formulated and incorporated therein extrinsic dyes which absorb photoexposure radiation whose reflectance it is desired to attenuate. Within the first preferred embodiment of the present invention, the blanket organic polymer anti-reflective coating (ARC) layer 18 is formed to a thickness sufficient to attenuate a microloading effect when etching the blanket second silicon layer 16, the blanket silicon containing dielectric layer 14 and the blanket first silicon layer 12 to form a corresponding patterned composite silicon/dielectric/silicon stack layer comprising a co-extensive patterned second silicon layer, patterned silicon containing dielectric layer and patterned first silicon layer. In order to realize the foregoing result within the first preferred embodiment of the present invention, the blanket organic polymer anti-reflective coating (ARC) layer 18 is typically and preferably formed to a thickness of from about 1000 to about 2000 angstroms from an organic polymer anti-reflective coating (ARC) material such as a polyimide organic polymer anti-reflective coating (ARC) material or a polysulfone anti-reflective coating (ARC) material as may be obtained, for example, and without limitation, from Brewer Science, Inc., Rolla, Mo., USA.

Within the first preferred embodiment of the present invention with respect to the patterned photoresist layer 20, the patterned photoresist layer 20 may be formed employing photoresist materials as are conventional in the art of microelectronics fabrication, including photoresist materials selected from the general groups of photoresist materials including but not limited to positive photoresist materials and negative photoresist materials. Preferably, the patterned photoresist layer 20 is formed to a thickness of from about 5000 to about 15000 angstroms.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket organic polymer anti-reflective coating layer 18, the blanket second silicon layer 16, the blanket silicon containing dielectric layer 14 and the blanket first silicon layer 12 have been patterned, while employing an etching plasma 22 along with the patterned photoresist layer 20 as an etch mask layer, to form a patterned organic polymer anti-reflective coating layer 18a, a patterned second silicon layer 16a, a patterned silicon containing dielectric layer 14a and a patterned first silicon layer 12a, where each of the foregoing patterned layers is co-extensive and where, although not specifically illustrated within the schematic cross-sectional diagram of FIG. 2, there is attenuated a microloading effect when forming a patterned composite silicon/dielectric/silicon stack layer comprising the patterned second silicon layer 16a, the patterned silicon containing dielectric layer 14a and the patterned first silicon layer 12a.

Within the first preferred embodiment of the present invention with respect to the etching plasma 22, the etching plasma 22 is employed within a single plasma etch method, and the etching plasma 22 employs a single etchant gas composition which upon plasma activation forms a chlorine containing etchant species. Within the first preferred embodiment of the present invention, the chlorine containing etchant species may be derived from chlorine containing etchant gases selected from the group of chlorine containing etchant gases including but not limited to chlorine and hydrogen chloride. Preferably, the etching plasma 22 also incorporates a sputtering component, such as but not limited to argon, and optionally includes nitrogen gas as a carrier gas which additionally serves to attenuate polymer residue formation. Similarly, the etching plasma 22 may also incorporate minor amounts of helium and oxygen. Preferably, the etching plasma 22 does not incorporate a bromine containing etchant gas, such as but not limited to bromine or hydrogen bromide, since a silicon containing dielectric material from which is formed the blanket silicon containing dielectric layer 14 will typically have an lowered etch rate within a plasma employing a bromine containing etchant gas.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein there is stripped from the patterned second silicon layer 16*a* the patterned organic polymer anti-reflective coating (ARC) layer 18*a* and the patterned photoresist layer 20. Within the first preferred embodiment of the present invention, the patterned organic polymer anti-reflective coating (ARC) layer 18*a* and the patterned photoresist layer 20 may be stripped from the microelectronics fabrication whose schematic cross-sectional diagram is illustrated within FIG. 2 to provide the microelectronics fabrication whose schematic cross-sectional diagram is illustrated in FIG. 3 employing methods and materials as are conventional in the art of microelectronics fabrication. Such methods will typically include, but are not limited to, wet chemical stripping methods and dry oxygen plasma stripping methods as are known in the art of microelectronics fabrication.

Upon forming the microelectronics fabrication whose schematic cross-sectional diagram is illustrated in FIG. 3, there is formed a microelectronics fabrication having formed therein a patterned composite silicon/dielectric/silicon stack layer comprising a patterned first silicon layer separated from a patterned second silicon layer by a patterned silicon containing dielectric layer, where the patterned composite silicon/dielectric/silicon stack layer is efficiently formed with an attenuated microloading effect. The method of the present invention realizes the foregoing objects by employing when forming the patterned composite silicon/dielectric/silicon stack layer a blanket organic polymer anti-reflective coating (ARC) layer interposed between a patterned photoresist layer and a series of corresponding blanket layers from which is subsequently formed the patterned composite silicon/dielectric/silicon stack layer, along with a single plasma etch method employing an etchant gas composition comprising an etchant gas which upon plasma activation forms a chlorine containing etchant species, preferably without a bromine containing etchant gas.

Second Preferred Embodiment

Figure 4:
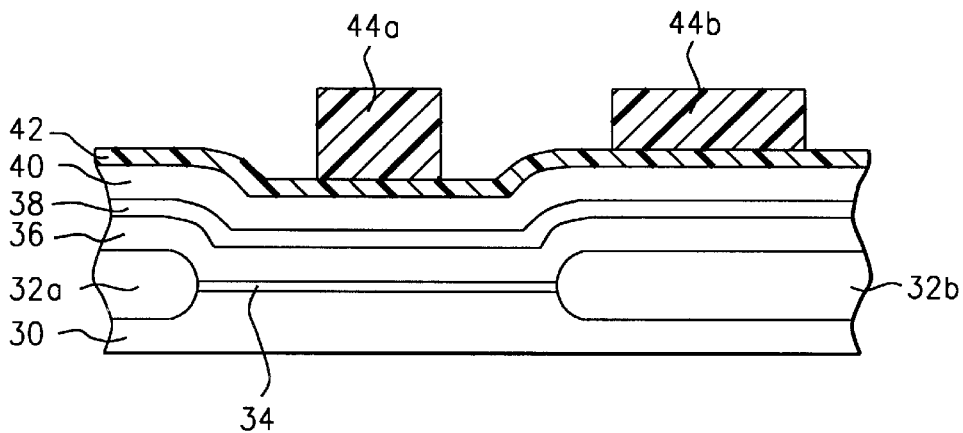
FIG. 4, FIG. 5, and FIG. 6 show a series of schematic cross-sectional diagrams illustrating the results of forming within a semiconductor integrated circuit microelectronics fabrication in accord with a more specific embodiment of the present invention which comprises a second preferred embodiment of the present invention a pair of patterned composite polysilicon/dielectric/polysilicon stack layers.
Figure 5:
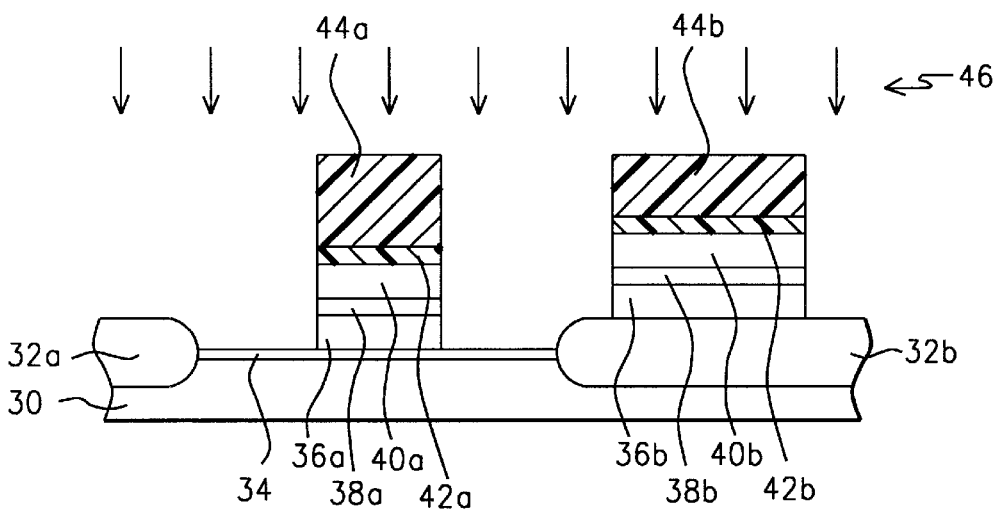
Figure 6:
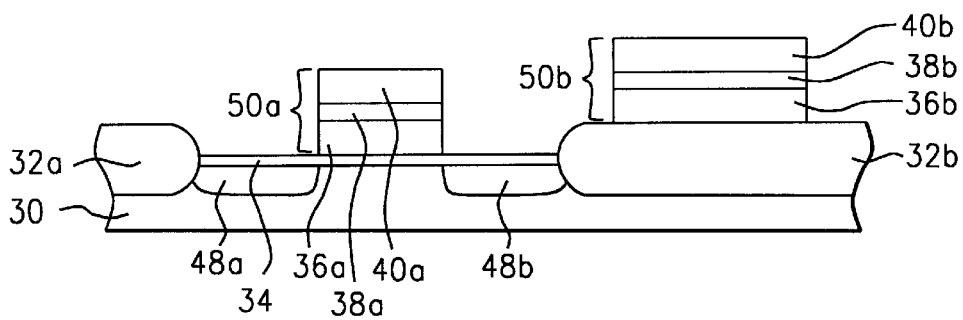

Referring now to FIG. 4 to FIG. 6, there is shown a series of schematic cross-sectional diagrams illustrating the results of forming within a semiconductor integrated circuit microelectronics fabrication in accord with a more specific embodiment of the present invention which comprises a second preferred embodiment of the present invention a pair of patterned composite polysilicon/dielectric/polysilicon stack layers in accord with the method of the present invention. Shown in FIG. 4 is a schematic cross-sectional diagram of the semiconductor integrated circuit microelectronics fabrication at an early stage in its fabrication in accord with the method of the present invention.

Shown in FIG. 4 is a semiconductor substrate 30 having formed within and upon its surface a pair of isolation regions 32*a* and 32*b* which defines an active region of the semiconductor substrate 30. Although semiconductor substrates are known in the art of semiconductor integrated circuit microelectronics fabrication with either dopant polarity, several dopant concentrations and various crystallographic orientations, for the second preferred embodiment of the present invention, the semiconductor substrate 30 is preferably a (100) silicon semiconductor substrate having an N- or P- doping.

Similarly, although it is also known in the art of semiconductor integrated circuit microelectronics fabrication that isolation regions may be formed within and upon semiconductor substrates while employing methods including but not limited to isolation region thermal growth methods and isolation region deposition/patterning methods, for the second preferred embodiment of the present invention the isolation regions 32*a* and 32*b* are preferably formed within and upon the semiconductor substrate 30 while employing an isolation region thermal growth method at a temperature of from about 900 to about 1200 degrees centigrade to form within and upon the semiconductor substrate 30 the pair of isolation regions 32*a* and 32*b* of silicon oxide.

There is also shown within FIG. 4 formed covering the active region of the semiconductor substrate 30 a blanket gate dielectric layer 34. Although it is known in the art of semiconductor integrated circuit microelectronics fabrication that gate dielectric layers may be formed employing methods including but not limited to gate dielectric layer thermal growth methods and gate dielectric layer deposition/patterning methods, for the second preferred embodiment of the present invention the blanket gate dielectric layer 34 is preferably formed employing a blanket gate dielectric layer thermal growth method at a temperature of from about 750 to about 900 degrees centigrade to form the blanket gate dielectric layer 34 of silicon oxide of thickness about 30 to about 500 angstroms upon the active region of the semiconductor substrate 30.

Finally, there is shown within FIG. 4 formed upon or over the semiconductor substrate 30 including the pair of isolation regions 32*a* and 32*b* and the blanket gate dielectric layer a series of four blanket layers, where the uppermost blanket layer within the series of four blanket layers has formed thereupon a pair of patterned photoresist layers 44*a* and 44*b*. The four blanket layers within the series of four blanket layers include: (1) a blanket first polysilicon layer 36 formed most closely to the semiconductor substrate 30; (2) a blanket silicon containing dielectric layer 38 formed upon the blanket first polysilicon layer 36; (3) a blanket second polysilicon layer 40 formed upon the blanket silicon containing dielectric layer 38; and (4) a blanket organic polymer anti-reflective coating (ARC) layer 42 formed upon the blanket second polysilicon layer 40.

Within the second preferred embodiment of the present invention, the blanket first polysilicon 36 is preferably formed employing methods, materials and dimensions analogous or equivalent to the methods, materials and dimensions employed in forming the blanket first silicon layer 12 within the first preferred embodiment of the present as illustrated within the schematic cross-sectional diagram of FIG. 1. Similarly, within the second preferred embodiment of the present invention the blanket silicon containing dielectric layer 38 is preferably formed employing methods, materials and dimensions analogous or equivalent to the methods, materials and dimensions employed in forming the blanket silicon containing dielectric layer 14 within the first preferred embodiment of the present invention as illustrated within the schematic cross-sectional diagram of FIG. 1. Yet similarly, within the second preferred embodiment of the present invention the blanket second polysilicon layer 40 is preferably formed employing methods, materials and dimensions analogous or equivalent to the methods, materials and dimensions employed in forming the blanket second silicon layer 16 within the first preferred embodiment of the present invention was illustrated within the schematic cross-sectional diagram of in FIG. 1. Finally, within the second preferred embodiment of the present invention, the blanket organic polymer anti-reflective coating (ARC) layer 42 is preferably formed employing methods, materials and dimensions analogous or equivalent to the methods, materials and dimensions employed in forming the blanket organic polymer anti-reflective coating (ARC) layer 18 within the first preferred embodiment of the present invention as illustrated within the schematic cross-sectional diagram of FIG. 1.

Within the second preferred embodiment of the present invention with respect to the patterned photoresist layers 44a and 44b, each of the patterned photoresist layers 44a and 44b is preferably formed employing methods, materials and thickness dimensions analogous or equivalent to the methods, materials and thickness dimensions employed in forming the patterned photoresist layer 20 within the first preferred embodiment of the present invention as illustrated within FIG. 1. Within the second preferred embodiment of the present invention, a linewidth of the patterned photoresist layer 44a is preferably from about 0.1 to about 3.0 microns, while a linewidth of the patterned photoresist layer 44b is preferably also from about 0.1 to about 3.0 microns.

Referring now to FIG. 5, there is shown a schematic cross-sectional diagram illustrating the results of further processing of the semiconductor integrated circuit microelectronics fabrication whose schematic cross-sectional diagram is illustrated in FIG. 4. Shown in FIG. 5 is a schematic cross-sectional diagram of a semiconductor integrated circuit microelectronics fabrication otherwise equivalent to the semiconductor integrated circuit microelectronics fabrication whose schematic cross-sectional diagram is illustrated in FIG. 4, but wherein each of the blanket first polysilicon layer 36, the blanket silicon containing dielectric layer 38, the blanket second polysilicon layer 40 and the blanket organic polymer anti-reflective coating (ARC) layer 42 has been patterned to form a corresponding series of patterned first polysilicon layers 36a and 36b, patterned silicon containing dielectric layers 38a and 38b, patterned second polysilicon layers 40a and 40b and patterned organic polymer anti-reflective coating (ARC) layers 42a and 42b, while employing the pair of patterned photoresist layers 44a and 44b as a corresponding pair of etch mask layers and while employing an etching plasma 46.

Within the second preferred embodiment of the present invention, the etching plasma 46 is preferably formed employing methods and materials analogous or equivalent to the methods and materials which are employed in forming the etching plasma 22 within the first preferred embodiment of the present invention as illustrated within FIG. 2. Within the second preferred embodiment of the present invention the etching plasma preferably employs an etchant gas composition comprising chlorine and a sputtering gas component such as but not limited to argon.

Preferably, the etching plasma 46 also employs: (1) a reactor chamber pressure of from about 3 to about 300 mtorr; (2) a source radio frequency power of from about 100 to about 800 watts at a source radio frequency of 13.56 MHZ; (3) a bias power of from about 100 to about 500 watts; (4) a semiconductor substrate 30 temperature of from about 20 to about 80 degrees centigrade; (5) a chlorine flow rate of from about 20 to about 200 standard cubic centimeters per centimeter (sccm); (6) an argon flow of up to 500 standard cubic centimeters per minute (sccm); (7) an optional helium flow rate of up to about 20 standard cubic centimeters per minute (sccm); and (8) an optional oxygen flow rate of up to about 20 standard cubic centimeters per minute (sccm), for a time period sufficient to etch completely through the blanket organic polymer anti-reflective coating (ARC) layer 42, the blanket second polysilicon layer 40, the blanket silicon containing dielectric layer 38 and the blanket first polysilicon layer 36.

Referring now to FIG. 6, there is shown a schematic cross-sectional diagram illustrating the results of further processing of the semiconductor integrated circuit microelectronics fabrication whose schematic cross-sectional diagram is illustrated in FIG. 5. Shown in FIG. 6 is a schematic cross-sectional diagram of a semiconductor integrated circuit microelectronics fabrication in part otherwise equivalent to the semiconductor integrated circuit microelectronics fabrication whose schematic cross-sectional diagram is illustrated in FIG. 5, but wherein the patterned photoresist layers 44a and 44b and the patterned organic polymer anti-reflective coating (ARC) layers 42a and 42b are stripped from the semiconductor integrated circuit microelectronics fabrication to yield a pair of patterned composite polysilicon/dielectric/polysilicon stack layers 50a or 50b comprising the patterned first polysilicon layer 36a or 36b separated from the corresponding patterned second polysilicon layer 40a or 40b by the corresponding patterned silicon containing dielectric layer 38a or 38b.

Shown also within FIG. 6 formed within the active region of the semiconductor substrate 30 at areas not covered by the patterned composite stack layer 50a is a pair of source/drain regions 48a and 48b. The source/drain regions 48a and 48b may be formed into the active region of the semiconductor substrate 30 employing methods and materials as are conventional in the art of semiconductor integrated circuit microelectronics fabrication, such methods typically including ion implant methods employing appropriate dopant ions at an ion implant dosage of from about 1E14 to about 8E15 dopant ions per square centimeter and an ion implantation energy of from about 20 to about 100 kev.

Upon forming the semiconductor integrated circuit microelectronics fabrication whose schematic cross-sectional diagram is illustrated in FIG. 6, there is formed a semiconductor integrated circuit microelectronics fabrication having formed therein a field effect transistor (FET) employing as its gate electrode a patterned composite stack layer comprising a patterned first polysilicon layer separated from a patterned second polysilicon layer by a patterned silicon containing dielectric layer. Such field effect transistors (FETS) are useful within electrically erasable programmable read only memory (EEPROM) semiconductor integrated circuits. The gate electrode within the field effect transistor (FET) is formed simultaneously with a second patterned composite polysilicon/dielectric/polysilicon stack layer 50b which typically and preferably serves as a planar capacitor within the semiconductor integrated circuit microelectronics fabrication whose schematic cross-sectional diagram is illustrated in FIG. 6.

EXAMPLES

Upon or over a first of two silicon semiconductor substrates was formed a series of blanket layers in accord with the preferred embodiments of the present invention. The series of blanket layers included: (1) a blanket thermally oxidized silicon oxide dielectric substrate layer of thickness about 1000 angstroms formed upon the silicon semiconductor substrate employing thermal oxidation of the silicon semiconductor substrate at a temperature of about 900 degrees centigrade for a time period of about 30 minutes; (2) a blanket first polysilicon layer formed upon the blanket thermally oxidized silicon oxide dielectric substrate layer to a thickness of about 500 angstroms employing a chemical vapor deposition (CVD) method; (3) a blanket inter-polysilicon silicon oxide dielectric layer formed upon the blanket first polysilicon layer at a thickness of about 800 angstroms employing a chemical vapor deposition (CVD) method; (4) a blanket second polysilicon layer formed upon the blanket inter-polysilicon silicon oxide dielectric layer to a thickness of about 500 angstroms while employing methods and materials equivalent to the methods and materials employed in forming the blanket first polysilicon layer; and (5) a blanket organic polymer anti-reflective coating (ARC) layer formed upon the blanket second polysilicon layer to a thickness of about 1500 angstroms.

Finally, there was formed upon the blanket organic polymer anti-reflective coating (ARC) layer a patterned photoresist layer formed employing a positive photoresist material. The patterned positive photoresist layer was formed to a thickness of about 10000 angstroms with a minimum linewidth dimension of about 0.5 microns to form the patterned positive photoresist layer with areas of pattern density (i.e. areal percent patterned photoresist layer coverage upon the blanket organic polymer anti-reflective coating (ARC) layer) varying from about 3 percent to about 85 percent.

Upon a second silicon semiconductor substrate was formed a series of blanket layers and a patterned photoresist layer otherwise equivalent to the series of blanket layers and the patterned photoresist layer formed upon the first silicon semiconductor substrate, but wherein there was omitted the blanket organic polymer anti-reflective coating (ARC) layer.

The two series of blanket layers upon each of the two silicon semiconductor substrates was then etched employing a chlorine plasma to form a series of patterned layers from the series of blanket layers, with the exception that the blanket thermally oxidized silicon oxide dielectric substrate layer was not completely etched. The chlorine plasma employed: (1) a reactor chamber pressure of about 5 mtorr; (2) a source radio frequency power of about 200 watts at a source radio frequency of 13.56 MHZ; (3) a bias power of about 150 watts; (4) a silicon semiconductor substrate temperature of about 50 degrees centigrade; (5) a chlorine flow rate of about 90 standard cubic centimeters per minute (sccm); (6) a helium flow of about 2 standard cubic centimeters per minute (sccm); and (7) an oxygen flow of about 2 standard cubic centimeters per minute (sccm).

After stripping the patterned photoresist layers and the patterned organic polymer anti-reflective coating (ARC) layer from the two silicon semiconductor substrates, the series of patterned composite polysilicon/silicon oxide/polysilicon stack layers formed upon each of the two silicon semiconductor substrates was then inspected employing a scanning electron microscopy method to ascertain the uniformity with which the patterned composite polysilicon/silicon oxide/polysilicon stack layers were formed.

Upon the silicon semiconductor substrate over which was formed the organic polymer anti-reflective coating (ARC) layer, the patterned composite polysilicon/silicon oxide/polysilicon stack layers were uniformly formed independent of the pattern density. Upon the silicon semiconductor substrate over which was omitted the blanket organic polymer anti-reflective coating (ARC) layer the patterned composite polysilicon/silicon oxide/polysilicon stack layers were formed nonuniformly, with patterned second polysilicon layer erosion at a pattern density of less than about 20 percent. Thus, the present invention provides a method for efficiently and with attenuated microloading effect forming a patterned composite polysilicon/dielectric/polysilicon stack layer or patterned composite silicon/dielectric/silicon stack layer within a microelectronics fabrication.

As is understood by a person skilled in the art, the preferred embodiments and examples of the present invention are illustrative of the present invention rather than limiting of the present invention. Revisions and modifications may be made to methods, materials, structures and dimensions through which may be formed microelectronics fabrications and semiconductor integrated circuit microelectronics fabrications having formed therein patterned composite silicon/dielectric/silicon stack layers in accord with the preferred embodiments and examples of the present invention while still providing microelectronics fabrications and semiconductor integrated circuit microelectronics fabrications having formed therein patterned composite silicon/dielectric/silicon stack layers in accord with the present invention, as defined by the appended claims.

What is claimed is:

1. A method for forming a patterned composite stack layer within a microelectronics fabrication comprising:
   providing a substrate;
   forming over the substrate a blanket first silicon layer;
   forming upon the blanket first silicon layer a blanket silicon containing dielectric layer;
   forming upon the blanket silicon containing dielectric layer a blanket second silicon layer;
   forming upon the blanket second silicon layer a blanket organic polymer anti-reflective coating (ARC) layer;
   forming upon the blanket organic polymer anti-reflective coating (ARC) layer a patterned photoresist layer; and
   etching sequentially while employing the patterned photoresist layer as a photoresist etch mask layer the blanket organic polymer anti-reflective coating (ARC) layer, the blanket second silicon layer, the blanket silicon containing dielectric layer and the blanket first silicon layer to form a patterned composite stack layer comprising a patterned second silicon layer coextensive with a patterned silicon containing dielectric layer in turn coextensive with a patterned first silicon layer, where the sequential etching is undertaken employing a single plasma etch method employing an etchant gas composition which upon plasma activation forms a chlorine containing etchant species.

2. The method of claim 1 wherein the presence of the blanket anti-reflective coating (ARC) layer attenuates a microloading effect when forming the patterned composite layer stack comprising the patterned second silicon layer, the patterned silicon containing dielectric layer and the patterned first silicon layer.

3. The method of claim 1 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

4. The method of claim 1 wherein the blanket first silicon layer and the blanket second silicon layer are each formed from a silicon material selected from the group consisting of amorphous silicon materials, monocrystalline silicon materials and polycrystalline silicon materials.

5. The method of claim 1 wherein the blanket silicon containing dielectric layer is formed from a silicon containing dielectric material selected from the group consisting of silicon oxide dielectric materials, silicon nitride dielectric materials, silicon oxynitride dielectric materials and composites of silicon oxide dielectric materials, silicon nitride dielectric materials and silicon oxynitride dielectric materials.

6. The method of claim 1 wherein the organic polymer anti-reflective coating (ARC) layer is formed from an organic polymer anti-reflective coating (ARC) material selected from the group consisting of polyimide organic polymer anti-reflective coating (ARC) materials and polysulfone organic polymer anti-reflective coating (ARC) materials.

7. The method of claim 1 wherein the etchant gas composition comprises a chlorine containing etchant gas without a bromine containing etchant gas.

8. A method for forming a patterned composite stack layer within a microelectronics fabrication comprising:

providing a substrate;

forming over the substrate a blanket first silicon layer;

forming upon the blanket first silicon layer a blanket silicon containing dielectric layer;

forming upon the blanket silicon containing dielectric layer a blanket second silicon layer;

forming upon the blanket second silicon layer a blanket organic polymer anti-reflective coating (ARC) layer;

forming upon the blanket organic polymer anti-reflective coating (ARC) layer a patterned photoresist layer; and etching sequentially while employing the patterned photoresist layer as a photoresist etch mask layer the blanket organic polymer anti-reflective coating (ARC) layer, the blanket second silicon layer, the blanket silicon containing dielectric layer and the blanket first silicon layer to form:

a first patterned composite stack layer comprising a patterned second silicon layer coextensive with a patterned silicon containing dielectric layer in turn coextensive with a patterned first silicon layer; and a second patterned composite stack layer comprising another patterned second silicon layer coextensive with another patterned silicon containing dielectric layer in turn coextensive with another patterned first silicon layer, where the sequential etching is undertaken employing a single plasma etch method employing an etchant gas composition which upon plasma activation forms a chlorine containing etchant species.

9. The method of claim 8 wherein the presence of the blanket anti-reflective coating (ARC) layer attenuates a microloading effect when forming the first patterned composite layer stack layer and the second patterned composite stack layer.

10. The method of claim 8 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

11. The method of claim 8 wherein the blanket first silicon layer and the blanket second silicon layer are each formed of a silicon material selected from the group consisting of amorphous silicon materials, monocrystalline silicon materials and polycrystalline silicon materials.

12. The method of claim 8 wherein the blanket silicon containing dielectric layer is formed from a silicon containing dielectric material selected from the group consisting of silicon oxide dielectric materials, silicon nitride dielectric materials, silicon oxynitride dielectric materials and composites of silicon oxide dielectric materials, silicon nitride dielectric materials and silicon oxynitride dielectric materials.

13. The method of claim 8 wherein the organic polymer anti-reflective coating (ARC) layer is formed from an organic polymer anti-reflective coating (ARC) material selected from the group consisting of polyimide organic polymer anti-reflective coating (ARC) materials and polysulfone organic polymer anti-reflective coating (ARC) materials.

14. The method of claim 8 wherein the etchant gas composition comprises a chlorine containing etchant gas without a bromine containing etchant gas.

15. The method of claim 8 wherein:

the substrate is a silicon semiconductor substrate employed within a semiconductor integrated circuit microelectronics fabrication;

the patterned first silicon layer, the other patterned first silicon layer, the patterned second silicon layer and the other patterned second silicon layer are each formed of a polysilicon material and the first patterned composite stack layer is employed as a polysilicon capacitor within the semiconductor integrated circuit microelectronics fabrication and the second patterned composite stack layer is employed as a gate electrode within a field effect transistor (FET) within the semiconductor integrated circuit microelectronics fabrication.

\* \* \* \* \*